(12) United States Patent
Mizuno et al.

(10) Patent No.: US 6,570,191 B2
(45) Date of Patent: May 27, 2003

(54) SURFACE-LIGHT-EMITTING DEVICE INCLUDING ALGALNP AND ALGAAS MULTI-FILM REFLECTING LAYERS

(75) Inventors: Yoshiyuki Mizuno, Nagoya (JP); Masumi Hirotani, Tokai (JP); Terence Edward Sale, Northamptonshire (GB); Chuan-Cheng Tu, Tainan (TW)

(73) Assignees: Daido Steel Co., Ltd., Nagoya (JP); The University of Surrey, Guildford (GB); United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/026,794

(22) Filed: Dec. 27, 2001

(65) Prior Publication Data

US 2002/0121643 A1 Sep. 5, 2002

(30) Foreign Application Priority Data

Dec. 28, 2000 (JP) ........................................ 2000-401607

(51) Int. Cl.[7] ..................... H01L 33/00; H01L 29/861
(52) U.S. Cl. ........................... 257/98; 257/99; 257/103; 257/96; 257/94; 257/22; 257/14
(58) Field of Search ............................... 257/96, 98, 99, 257/103, 14, 22, 94; 372/46, 45, 50, 96

(56) References Cited

U.S. PATENT DOCUMENTS 5,557,627 A * 9/1996 Schneider, Jr. et al. ........ 372/45
5,789,768 A * 8/1998 Lee et al. ..................... 257/103

FOREIGN PATENT DOCUMENTS

| JP | 04-167484 | 6/1992 |
|---|---|---|
| JP | 10-027945 | 1/1998 |
| JP | 11-054846 | 2/1999 |
| JP | 2000-299492 | 10/2000 |

OTHER PUBLICATIONS

J.A. Lott, et al. "AlGaInP Visible Resonant Cavity Light-Emitting Diodes", IEEE Photonics Technology Letters, vol. 5, No. 6, Jun. 1993, pp. 631–633.

* cited by examiner

*Primary Examiner*—Minh Loan Tran
*Assistant Examiner*—Tan Tran
(74) *Attorney, Agent, or Firm*—Oblon, Spivak, McClelland, Maier & Neustadt, P.C.

(57) ABSTRACT

A surface-light-emitting device including a semiconductor substrate, and a laminar semiconductor structure consisting of a plurality of semiconductor layers formed by epitaxial growth on the semiconductor substrate, the laminar semiconductor structure including a light-generating layer, and two multi-film reflecting layers between which the light-generating layer is interposed and which constitute a light resonator for reflecting a light generated by the light-generating layer, the structure having a light-emitting surface at one of opposite ends thereof remote from the substrate, so that the light generated by the light-generating layer is emitted from the light-emitting surface, wherein the two multi-film reflecting layers consist of a first multi-film reflecting layer formed principally of AlGaInP on the substrate, and a second multi-film reflecting layer formed principally of AlGaAs on one of opposite sides of the light-generating layer which is remote from the substrate.

2 Claims, 5 Drawing Sheets

SURFACE-LIGHT-EMITTING DEVICE INCLUDING ALGALNP AND ALGAAS MULTI-FILM REFLECTING LAYERS

This application is based on Japanese Patent Application No. 2000-401607 filed Dec. 28, 2000, the contents of which are incorporated hereinto by reference.

BACKGROUND OF THE INVENTION

1. Field of the Invention

The present invention relates to improvements of a surface-light-emitting device including a light-generating layer and a light resonator constituted by two multi-film reflecting layers between which the light-emitting layer is interposed.

2. Discussion of Related Art

There is known a surface-light-emitting device including a semiconductor substrate and a plurality of semiconductor layers which are grown on the semiconductor substrate. The semiconductor layers comprise a light-generating layer (active portion), and a light resonator constituted by two multi-film reflecting layers (DBR: distributed-Bragg reflectors) which are located on the opposite sides of the light-generating layer, to reflect a light generated by the light-generating layer. The semiconductor layers further comprise an outermost semiconductor layer which is located on one of the opposite sides of a laminar semiconductor structure consisting of the above-indicated semiconductor layers, which one side is remote from the substrate. The outermost semiconductor layer has a light-emitting surface from which the light generated by the light-generating layer and resonated by the light resonator is emitted. Examples of such a surface-light-emitting device include a resonant-cavity light-emitting diode and a surface-light-emitting laser.

JP-A-2000-299492 discloses a light-emitting diode of quantum-well type, as an example of the surface-light-emitting device. This light-emitting diode includes a plurality of semiconductor layers laminated on a substrate. The semiconductor layers comprise a light-generating layer of a quantum-well structure having a thickness not larger than the wavelength (100 Å, i.e., 10 nm) of the electron wave, and a light resonator consisting of two reflecting layers which are located on the respective opposite sides of the light-generating layer and which reflect a light generated by the light-generating layer. By applying an electric current between a pair of electrodes formed on the respective opposite surfaces of a laminar semiconductor structure consisting of the semiconductor layers, the light generated by the light-generating layer is emitted from one of the opposite surfaces of the laminar semiconductor structure which is remote from the substrate. In the light-emitting diode disclosed in the above-identified publication, an electron wave within the light-generating layer and an optical wave within the light resonator are coupled together, so that the light-generating layer generates a light only in a resonance mode. This phenomenon so-called "a cavity QED effect" permits the emitted light to have a high degree of directivity and a narrow line width, and prevents total reflection of the light by the crystal surface, assuring an advantage of a high degree of external quantum efficiency.

A known surface-light-emitting device as described above includes, for instance, an n-GaAs semiconductor substrate, and a first multi-film reflecting layer, a light-generating layer and a second multi-film reflecting layer which are successively grown on the substrate. The first multi-film reflecting layer consists of a multiplicity of n-(Al)GaAs/Al(Ga)As films superposed on each other such that the (Al)GaAs films and the Al(Ga)As films are alternately arranged. The ratios of the elements indicated in the parentheses are suitably selected, and may be zero. The second multi-film reflecting layer consists of a multiplicity of p-(Al)GaAs/Al(Ga)As films superposed on each other such that the (Al)GaAs films and the Al(Ga)As films are alternately arranged. The parentheses have the same meaning as described just above. Where the wavelength of the light to be emitted from the surface-light-emitting device is as short as about six hundred and some tens of nanometers (nm), the concentrations of Al of the (Al)GaAs films must be made relatively high in order to reduce the light absorptance. However, an increase in the Al concentration undesirably reduces or substantially zeros the refractive index at the boundaries of the alternately arranged films, leading to difficulty in obtaining a sufficiently high degree of reflectivity of the multi-film reflecting layers. Another problem encountered in the known surface-light-emitting device relates to a change of a gas used to form the first multi-film reflecting layer (formed on the side of the substrate) and the light-generating layer (active portion of the device). Described in detail, epitaxial growth of the AlGaInP/GaInP light-generating layer on the first multi-film reflecting layer is initiated by changing the gas from arsine $AsH_3$ which has been used for growing the As-based material of the first multi-film reflecting layer, to phosphine $PH_3$ to be used for the epitaxial growth of the light-generating layer on the first reflecting layer. However, this arsine-to-phosphine change of the gas takes a relatively long time, causing an increased surface roughness of the first reflecting layer, and oxidization of Al, making it difficult to form a high-quality active portion on the first reflecting layer, that is, the light-generating layer having a high quality on the first reflecting layer.

On the other hand, it has been proposed to form the first and second (n- and p-) multi-film reflecting layers consisting of (Al)GaInP/Al(Ga)InP films. The reflecting layers according to this proposal exhibit a high degree of reflectivity even where the light to be emitted has a considerably short wavelength. In addition, the epitaxial growth of the AlGaInP/GaInP light-generating layer on the first reflecting layer does not require a change from arsine $AsH_3$ to phosphine $PH_3$, before the epitaxial growth of the light-generating layer on the first reflecting layer. Accordingly, the light-generating layer serving as the active portion of the surface-light-emitting device can be advantageously given a high degree of crystallinity. However, the use of the p-(Al)GaInP/Al(Ga)InP second multi-film reflecting layer gives rise to a relatively large degree of carrier blockage, and an accordingly high electric resistance, and results in reduced enclosure of electrons, so that the operating efficiency of the surface-light-emitting device is deteriorated where the device is designed to emit a light having a relatively short wavelength. Another problem arises from the use of the (Al)GaInP/Al(Ga)InP films for the first and second (n- and p-) multi-film reflecting layers, where a mesa structure is formed by selective etching effected on the laminar semiconductor structure grown on the semiconductor substrate. That is, it is extremely difficult to practice a wet-etching process to form the mesa structure. Although the application of the wet-etching process is not impossible, the yield ratio in the production of the surface-light-emitting device is considerably low where the wet-etching process is used to form the mesa structure. In addition, the difficulty to form the mesa structure by the wet-etching process leads to difficulty to form a current-blocking region by subjecting the peripheral portion of the mesa structure to an oxidizing treatment.

SUMMARY OF THE INVENTION

The present invention was made in view of the prior art described above. It is therefore a principal object of the present invention to provide a surface-light-emitting device which includes multi-film reflecting layers having a high degree of reflectivity with respect to a relatively short wavelength of light, and a light-generating layer having a high degree of crystallinity, and which has a low electric resistance and exhibits a high operating efficiency. It is an optional object of this invention to provide a surface-light-emitting device including a laminar semiconductor structure which is formed on a semiconductor substrate and which has a mesa structure formed by wet-etching and having a current-blocking region formed by an oxidizing treatment.

The principal object indicated above may be achieved according to the principle of the present invention, which provides a surface-light-emitting device including a semiconductor substrate, and a laminar semiconductor structure consisting of a plurality of semiconductor layers formed by epitaxial growth on the semiconductor substrate, the laminar semiconductor structure including a light-generating layer, and two multi-film reflecting layers between which the light-generating layer is interposed and which cooperate to constitute a light resonator for reflecting a light generated by the light-generating layer, the laminar semiconductor structure having a light-emitting surface at one of opposite ends thereof remote from the semiconductor substrate, the light generated by the light-generating layer being emitted from the light-emitting surface, characterized in that the two multi-film reflecting layers consist of a first multi-film reflecting layer formed principally of AlGaInP on the semiconductor substrate, and a second multi-film reflecting layer formed principally of AlGaAs on one of opposite sides of the light-generating layer which is remote from the semiconductor substrate.

In the present surface-light-emitting device, the first multi-film reflecting layer formed on the semiconductor substrate, which is required to have a comparatively high degree of reflectivity, is formed principally or essentially of AlGaInP, while the second multi-film reflecting layer located on the side of the light-emitting surface is formed principally or essentially of AlGaAs. The first multi-film reflecting layer formed principally of AlGaInP has a large difference between refractive index values of adjacent ones of the alternately arranged films, and a low degree of light absorptance, so that the first multi-film reflecting layer exhibits a high reflectivity, even where the light to be emitted has a relatively short wavelength. In addition, the formation of the light-generating layer (formed principally of AlGaInP/GaInP, for example) by epitaxial growth on the first multi-film reflecting layer does not require a change of a gas to form the light-generating layer after the first reflecting layer, so that the light-generating layer is given a high degree of crystallinity. Further, the first multi-film reflecting layer formed principally of AlGaInP has a lower electric resistance than a reflecting layer formed principally of AlGaAs, and the light-generating layer is interposed between the first reflecting layer formed principally of AlGaInP and the second reflecting layer formed principally of AlGaAs on the side of the light-emitting layer, so that a carrier-enclosing region for enclosing the carrier can be suitably formed upstream of the barriers as seen in the direction of movement of the carrier, assuring a high degree of operating efficiency of the device.

According to one preferred form of this invention, the semiconductor substrate is formed of n-GaAs, and the first multi-film reflecting layer consists of n-(Al)GaInP films and n-Al(Ga)InP films which are alternately laminated on each other, while the second multi-film reflecting layer consists of p-(Al)GaAs films and p-Al(Ga)As films which are alternately laminated on each other. In this case, the light-generating layer is formed of AlGaInP/GaInP. In the device according to this preferred form of the present invention, the first multi-film reflecting layer consisting of the alternately arranged n-(Al)GaInP films and n-Al(Ga)InP films has a high refractive index and a low degree of light absorptance, and exhibits a high degree of reflectivity even where the light to be emitted has a comparatively short wavelength, and the formation of the light-generating layer of AlGaInP/GaInP by epitaxial growth on the first multi-film reflecting layer of n-(Al)GaInP/Al(Ga)InP does not require a change of the gas to form the light-generating layer on the first reflecting layer, so that the light-generating layer is given a high degree of crystallinity. Further, the first multi-film reflecting layer consisting of the alternately arranged n-(Al)GaInP films and n-Al(Ga)InP films has a lower carrier blockage and a lower electric resistance than a reflecting layer consisting of alternately arranged n-(Al)GaAs films and n-Al(Ga)As films, and the light-generating layer is interposed between the first reflecting layer consisting of the alternately arranged n-(Al)GaInP films and n-Al(Ga)InP films and the second reflecting layer consisting of the alternately arranged p-(Al)GaAs films and p-Al(Ga)As films, so that carrier-enclosing regions $K_e$ and $K_h$ for enclosing the carrier can be suitably formed upstream of the barriers as seen in the direction of movement of the carrier (electrons and holes), assuring a high degree of light-emitting efficiency of the device. Where the laminar semiconductor structure grown on the semiconductor substrate includes a mesa structure formed by etching an end portion of the structure, as described below in detail, an ordinary etching process may be used for easy formation of the mesa structure, since the second multi-film reflecting layer formed of p-(Al)GaAs/Al(Ga)As does not include phosphorus (P). Further, a non-electrically-conductive current-blocking region can be easily formed by oxidizing aluminum (Al) in an exposed portion of the mesa structure which includes the second reflecting layer formed of p-(Al)GaAs/Al(Ga)As.

According to another preferred form of this invention, the laminar semiconductor structure includes a mesa structure which has the light-emitting surface and the second multi-film reflecting layer, the mesa structure being formed by etching an end portion of the laminar semiconductor structure, which end portion is laminated on the light-generating layer, the mesa structure having a smaller cross sectional area taken in a plane parallel to the light-emitting surface, than the other portion of the laminar structure, the second multi-film reflecting layer comprising a generally annular non-electrically-conductive current-blocking region which is formed by oxidizing an exposed portion of the mesa structure which is a peripheral part as seen in the above-indicated plane. In this arrangement, the generally annular non-electrically-conductive current-blocking region can be easily formed by oxidizing the peripheral portion of the mesa structure, since the peripheral portion of the mesa structure is exposed in the radial direction of the mesa structure.

According to a further preferred form of this invention, the light-generating layer includes at least one active layer of quantum-well structure each interposed between adjacent two barrier layers, each active layer and the adjacent two barrier layers being located between the first and second multi-film reflecting layers such that each active layer is aligned with an antinode of the light resonated by the light resonator. In the present arrangement, an electron wave within the light-generating layer and an optical wave within the light resonator are coupled together, so as to provide a so-called "cavity QED effect" permitting the light-generating layer to generate a light only in a resonance mode. Accordingly, the light emitted from the light-emitting surface has a high degree of directivity and a narrow line width, without total reflection of the light by the monocrystalline semiconductor surface, assuring a high degree of quantum efficiency and a large optical output.

BRIEF DESCRIPTION OF THE INVENTION

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENT

Figure 1:
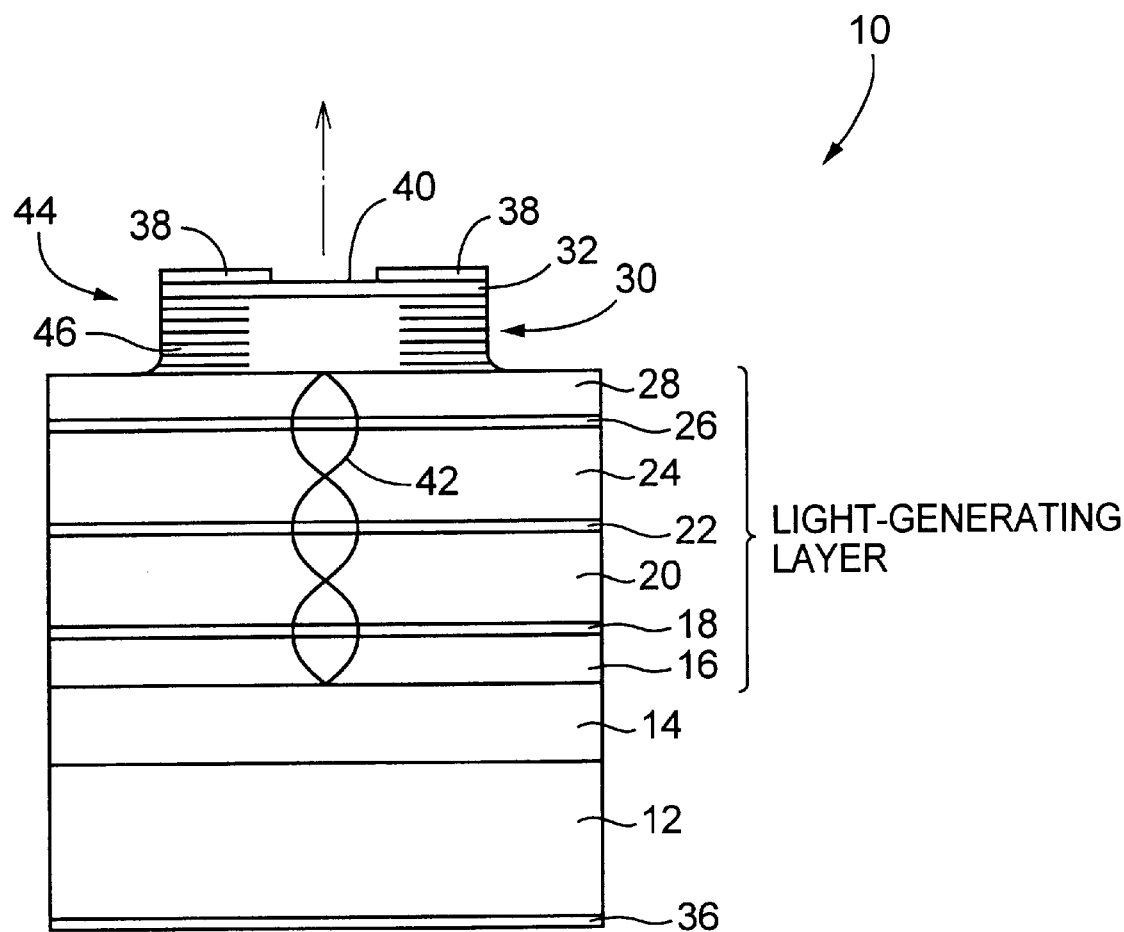
FIG. 1 is a cross sectional view schematically illustrating a surface-light-emitting diode constructed according to one embodiment of this invention.

Referring to the drawings, there will be described in detail the presently preferred embodiments of this invention. It is noted that the drawings do not necessarily accurately show relative dimensional ratios of various elements.

Reference is first made to FIG. 1, which shows a surface-light-emitting device in the form of a quantum-well type diode, that is, a light-emitting diode 10 of surface-emitting type. As shown in FIG. 1, the light-emitting diode 10 includes a monocrystalline semiconductor substrate 12, and a laminar semiconductor structure consisting of a first reflecting layer 14, a first barrier layer 16, a first active layer 18, a second barrier layer 20, a second active layer 22, a third barrier layer 24, a third active layer 26, a fourth barrier layer 28, a second reflecting layer 30, and a cap layer 32, which layers 14–32 are formed one after another in the order of description on the substrate 12. The layers 14–32 are formed on the substrate 12, by an epitaxial growth process such as MOCVD (Metal Organic Chemical Vapor Deposition). The light-emitting diode 10 further includes a lower electrode 36 formed by sputtering on an exposed lower surface of the substrate 12, and an upper electrode 38 formed by sputtering on an exposed upper surface of the cap layer 32. As indicated in FIG. 1, the layers 16–28 cooperate to constitute a light-generating layer for generating a light. The first and second reflecting layers 14, 30 respectively formed on the substrate 12 and the fourth barrier layer 28 cooperate to constitute a light resonator. The light generated by the light-generating layer 16–28 and resonated by the light resonator 14, 30 is emitted from a light-emitting surface 40, which is the upper surface of the cap layer 32 on which the upper electrode 38 is formed as described above.

The substrate 12 indicated above is an n-type compound semiconductor consisting of an n-GaAs single crystal having a thickness of about 350 $\mu$m, for instance. The first reflecting layer 14 formed on the substrate 12 consists of a plurality or multiplicity of compound semiconductor pairs, for example, 30 pairs of compound semiconductors, each pair consisting of an n-(Al)GaInP monocrystalline compound semiconductor film having a thickness of about 45 nm, and an n-Al(Ga)InP monocrystalline compound semiconductor film having a thickness of about 47 nm. These two monocrystalline compound semiconductor films of the compound semiconductor pairs are alternately laminated or superposed on each other such that the first n-(Al)GaInP film is formed on the substrate 12. The first reflecting layer 14 consisting of the compound semiconductor pairs described above functions as an n-type distributed-Bragg reflector (DBR). The (Al) and (Ga) in the "n-(Al)GaInP film" and "n-Al(Ga)InP film" indicate that the ratios of Al and Ga are suitably selected within a range between 0 and 0.5. Namely, Al and Ga may be absent. The first reflecting layer 14 may be represented by n-(Al$_{1-x}$Ga$_x$)InP/n-(Al$_y$Ga$_{1-y}$)InP. "X" and "Y" represent crystal mixing ratios which are larger than 0.5 and equal to or smaller than 1. The thickness (optical dimension) of each monocrystalline compound semiconductor film of the first reflecting layer 14 is determined to be equal to about ¼ of the resonance wavelength of the light resonator, which will be described in detail.

The first through fourth barrier layers 16, 20, 24 and 28 are i-(Ga$_{1-x}$Al$_x$)InP monocrystalline compound semiconductor layers, for example. The crystal mixing ratio X is larger than 0 and equal to or smaller than 1. The four barrier layers 16, 20, 24, 28, and the first, second and third active layers 18, 22, 26 are laminated on each other such that each active layer is interposed between the adjacent two barrier layers. The first and fourth barrier layers 16, 28 have a thickness of about 43 nm, while the second and third barrier layers 20, 24 have a thickness of about 86 nm. Accordingly, a distance $d_{12}$ between the first and second active layers 18, 22 and a distance $d_{23}$ between the second and third active layers 22, 26 are both equal to about 86 nm. The distances $d_{12}$, $d_{23}$ of about 86 nm is equal to about one half (½) of a peak wavelength of a composite light which is composed of the lights generated by the three active layers 18, 22, 26 and which is emitted from the light-emitting surface 40. That is, the distances are equal to about one half of the resonance wavelength.

The first, second and third active layers 18, 22, 26 each of which is interposed between the corresponding adjacent two of the first through fourth barrier layers 16, 20, 24, 28 are so-called "quantum wells" formed of i-Ga$_{0.55}$In$_{0.45}$P monocrystalline compound semiconductor layers. The thickness values of the first, second and third active layers 18, 22, 26 are determined such that the active layers provide the quantum wells whose energy levels are discontinuous with one another. For instance, the thickness values of the active layers 18, 22, 26 are about 8.3 nm, about 6.1 nm and about 4.4 nm, respectively, which values are sufficiently smaller than the wavelength of the electron wave, i.e., 100 nm. Accordingly, the peak wavelengths of the emission spectra of the active layers 18, 22, 26 at the room temperature are about 625 nm, about 615 nm and about 607 nm, respectively. In the light-emitting diode 10 according to the present embodiment, the barrier layers 16, 20, 24, 28 and the active layers 18, 22, 26 cooperate to constitute the light-generating layer.

Like the first reflecting layer 14 formed on the substrate 12, the second reflecting layer 30 on the side of the light-emitting surface 40 indicated above consists of a plurality or multiplicity of compound semiconductor pairs, for example, 10 pairs of compound semiconductors, each pair consisting of an p-(Al)GaAs monocrystalline compound semiconductor film having a thickness of about 41 nm, and an p-Al(Ga)As monocrystalline compound semiconductor film having a thickness of about 48 nm. These two monocrystalline compound semiconductor films of the compound semiconductor pairs are alternately laminated or superposed on each other to form the second reflecting layer 30, which functions as a p-type distributed-Bragg reflector (DBR). The (Al) and (Ga) in the "p-(Al)GaAs film" and "p-Al(Ga)As film" indicate that the ratios of Al and Ga are suitably selected within a range between 0 and 0.5. Namely, Al and Ga may be absent. The second reflecting layer 30 may be represented by p-$Al_{1-X}Ga_XAs$/p-$Al_YGa_{1-Y}As$. "X" and "Y" represent crystal mixing ratios which are larger than 0.5 and equal to or smaller than 1. The thickness (optical dimension) of each monocrystalline compound semiconductor film of the second reflecting layer 30 is determined to be equal to about ¼ of the resonance wavelength of the light resonator.

In the present embodiment, the two reflecting layers 14, 30 cooperate to constitute the light resonator, as described above, and a distance between the two reflecting layers 14, 30, that is, a length L of the light resonator is about 915 nm, as measured when the light resonator is in vacuum wherein the refractive index n is equal to 1. The length L (about 915 nm) of the light resonator is about 1.5 times the peak wavelength (=610 nm) of the spectrum of the composite light which is composed of the lights generated by the active layers 18, 22, 26 and which is emitted from the light-emitting surface 40. According to this arrangement, the lights generated by the active layers 18, 22, 26 are repeatedly reflected by and between the first and second reflecting layers 14, 30, to thereby produce a standing wave 42, as shown in FIG. 1. Since the length L of the light resonator and the thickness values of the first through fourth barrier layers 16, 20, 24, 28 are determined as described above, the active layers 18, 22, 26 are aligned with respective antinodes of the standing wave 42, as shown in FIG. 1. In the present arrangement, an electron wave within the light-generating layer 16–28 and an optical wave within the light resonator 14, 30 are coupled together, so as to provide the so-called "cavity QED effect" permitting the light-generating layer to generate a light only in a resonance mode. Accordingly, the light emitted from the light-emitting surface 40 has a high degree of directivity and a narrow line width, without total reflection of the light by the monocrystalline semiconductor surface, assuring a high degree of quantum efficiency and a large optical output. In the present embodiment wherein the semiconductor layers 16–28 interposed between the reflecting layers 14, 30 of the light resonator are substantially constituted by a compound semiconductor of InGaAlP, the diffusion length of the carrier (electrons or holes) in the light resonator is about 0.5 μm, and the coherent length of the electrons is about 50 nm. In this arrangement, the distance $d_{12}$ (86 nm) between the first and second active layers 18, 22 and the distance $d_{23}$ (86 nm) between the second and third active layers 22, 26 are sufficiently smaller than the diffusion length of the carrier and are sufficiently larger than the coherent length of the electrons.

In the present light-emitting diode 10 of surface-emitting type, an end portion of the laminar semiconductor structure 14–32, which consists of the second multi-layer reflecting layer 30 and the cap layer 32 and which does not include phosphorus (P), is etched into a mesa structure 44 formed on the light-generating layer which consists of the barrier layers 16, 20, 24, 28 and the active layers 18, 22, 26 and which includes phosphorus (P). That is, the mesa structure 44 is formed in a cylindrical shape by subjecting the second reflecting layer 30 and the cap layer 32 to an etching operation, such that the cylindrical mesa structure 44 has a smaller cross sectional area taken in a plane parallel to the light-emitting surface 40, than the other portion of the laminar semiconductor structure which consists of the first multi-film reflecting layer 14 and the light-generating layer 16–28. The etching process is effected by using a suitable organic acid such as $H_2SO_4$, $H_2O_4$ or $H_2O$. An exposed portion of the mesa structure 44 which is a peripheral part as seen in the above-indicated plane is subjected to an oxidizing treatment, so that the second multi-film reflecting layer 30 which constitutes a part of the mesa structure 44 is given a generally annular non-electrically-conductive current-blocking region 46. For instance, the current-blocking region 46 is formed of aluminum oxide.

The lower electrode 36 has a thickness of about 1 μm and has a laminar structure consisting of a Au—Ge alloy layer, a Ni layer and a Au layer which are superposed on each other in this order of description on the semiconductor substrate 12, so as to cover the entirety of the lower or exposed surface of the substrate 12. On the other hand, the upper electrode 38 has a thickness of about 1 μm and has a laminar structure consisting of a Au—Zn alloy layer and a Au layer which are superposed on each other in this order on the upper or exposed surface 40 of the cap layer 32, so as to cover an annular peripheral portion of the upper surface 40 (light-emitting surface), that is, so as to cover the upper surface 40 except a circular central portion thereof. The thus formed upper electrode 38 has an annular shape. The lower and upper electrodes 36, 38 are ohmic electrodes.

The surface-light-emitting diode 10 constructed as described above is produced in the following manner, for instance. Initially, all layers from the first reflecting layer 14 through the cap layer 32 are successively formed by crystal growth on the substrate 12, by MOCVD method, for instance, so as to form an epitaxial wafer. Then, a resist is applied to cover only a circular central region of the upper surface 40 of the cap layer 32, which central region has a considerably large diameter than the above-indicated circular central portion defined by the annular upper electrode 38. The surface 44 whose circular central region is covered by the resist is subjected to a wet-etching operation by using an etching liquid consisting of an organic acid (e.g., sulfuric acid, citric acid or phosphoric acid) and an aqueous solution of hydrogen peroxide, so that the end portion of the laminar semiconductor structure 14–32 which is remote from the substrate 12 and which includes the second multi-film reflecting layer 30 and the cap layer 32 that do not include phosphorus (P) is removed at its peripheral portion, whereby the mesa structure 44 described above is formed so as to extend from the surface of the fourth barrier layer 28.

Then, the mesa structure 44 is subjected to a heat-treatment at 375° C. or higher in an atmosphere including water, so that the annular exposed portion of the second reflecting layer 30 of the mesa structure 44, which annular exposed portion is a peripheral part as seen in a plane parallel to the light-emitting surface 40, is subjected to natural oxidation or oxidization of aluminum, in particular, at 375° C. or higher under a highly humid condition, whereby a generally annular non-electrically-conductive current-blocking region 46 is formed of the aluminum-oxidized annular exposed portion of the second reflecting layer 30. The surface-light-emitting device 10 is obtained by cutting the thus produced wafer into pieces in the form of chips each having a suitable size, as well known in the art.

In the surface-light-emitting diode 10 according to the present embodiment of this invention, the first multi-film reflecting layer 14 formed on the semiconductor substrate 12, which is required to have a comparatively high degree of reflectivity, is formed of AlGaInP, while the second multi-film reflecting layer 30 located on the side of the light-emitting surface 40 is formed of AlGaAs. The alternately arranged (Al)GaInP films and Al(Ga)InP films of the first reflecting layer 14 have a large difference of refractive index, and a low degree of light absorptance, so that the first reflecting layer 14 exhibits a high degree of reflectivity even with respect to a light having a comparatively short wavelength. Further, the formation of the light-generating layer of AlGaInP/GaInP by epitaxial growth on the first reflecting layer 14 does not require a change of a gas from arsine $AsH_3$ to phosphine $PH_3$, for example, so that the light-generating layer (16–28) has a high degree of crystallinity. In addition, the first multi-film reflecting layer 14 consisting of the alternately arranged n-(Al)GaInP films and n-Al(Ga)InP films has a lower carrier blockage and a lower electric resistance than a reflecting layer consisting of alternately arranged n-(Al)GaAs films and n-Al(Ga)As films. Further, the light-generating layer formed of AlGaInP/GaInP is interposed between the first reflecting layer consisting of the alternately arranged n-(Al)GaInP films and n-Al(Ga)InP films and the second reflecting layer consisting of the alternately arranged p-(Al)GaAs films and p-Al(Ga)As films, so that carrier-enclosing regions $K_e$ and $K_h$ for enclosing the carrier can be suitably formed upstream of the barriers as seen in the direction of movement of the carrier (electrons and holes), assuring a high degree of light-emitting efficiency of the surface-light-emitting diode 10. Moreover, the laminar semiconductor structure grown on the semiconductor substrate includes the mesa structure 44 formed by etching the end portion of the laminar semiconductor structure 16–32, as described above. This mesa structure 44 can be easily formed by an ordinary etching process, since the second multi-film reflecting layer formed of p-(Al)GaAs/Al(Ga)As does not include phosphorus (P). Further, the non-electrically-conductive current-blocking region 46 can be easily formed by oxidizing aluminum (Al) in the exposed peripheral portion of the mesa structure 44 which includes the second reflecting layer formed of p-(Al) GaAs/Al(Ga)As.

In the present surface-light-emitting diode 10, the laminar semiconductor structure 16–32 includes the mesa structure 44 which has the light-emitting surface 40 and the second multi-film reflecting layer 30. The mesa structure 44 is formed by wet-etching the end portion of the laminar semiconductor structure, which end portion is laminated on the light-generating layer 16–28. The mesa structure 44 has a smaller cross sectional area taken in a plane parallel to the light-emitting surface 40, than the other portion 16–28 of the laminar structure. The second multi-film reflecting layer 30 comprises the generally annular non-electrically-conductive current-blocking region 46 which is formed by oxidizing the exposed portion of the mesa structure which is a peripheral part as seen in the above-indicated plane. In this arrangement, the generally annular non-electrically-conductive current-blocking region 46 can be easily formed by oxidizing the peripheral portion of the mesa structure 44, since the peripheral portion of the mesa structure 44 is exposed in the radial direction of the mesa structure 44.

Further, the light-generating layer 16–28 of the present surface-light-emitting diode 10 includes the active layers 18, 22, 26 of quantum-well structure each interposed between adjacent two barrier layers 16, 20, 24, 28. Each active layer 18, 22, 26 and the adjacent two barrier layers 16, 20, 24, 28 are arranged between the first and second multi-film reflecting layers 14, 30 such that the active layers 18, 22, 26 are aligned with respective antinodes of the light resonated by the light resonator 14, 30. In the present arrangement, the electron wave within the light-generating layer and the optical wave within the light resonator are coupled together, so as to provide a so-called "cavity QED effect" permitting the light-generating layer to generate a light only in a resonance mode. Accordingly, the light emitted from the light-emitting surface 40 has a high degree of directivity and a narrow line width, without total reflection of the light by the monocrystalline semiconductor surface, assuring a high degree of quantum efficiency and a large optical output.

Figure 2:
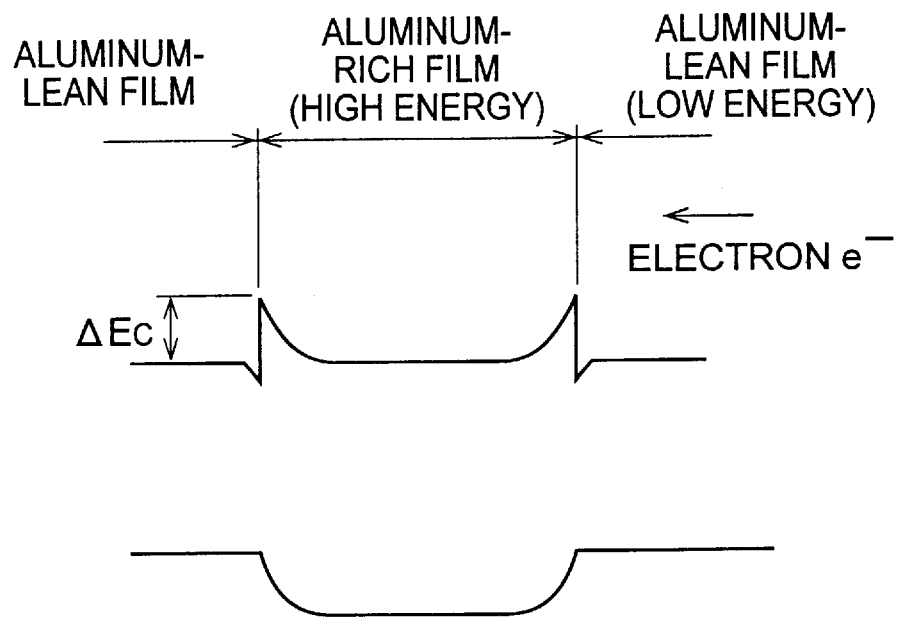
FIG. 2 is a view for explaining an energy band in a first multi-film reflecting layer which is formed on a substrate of the surface-light-emitting diode of FIG. 1 and which consists of n-type semiconductor films.
Figure 3:
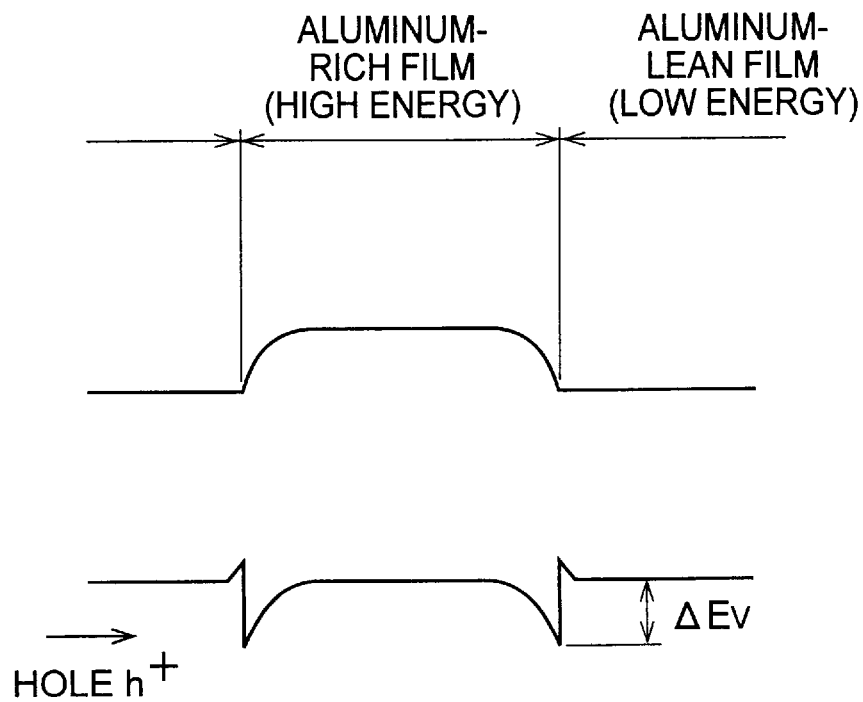
FIG. 3 is a view for explaining an energy band in a second multi-film reflecting layer which is formed on a light-emitting surface of the surface-light-emitting diode of FIG. 1 and which consists of p-type semiconductor films.

In the present surface-light-emitting diode 10, the materials of the first and second multi-film reflecting layers 14, 30 are selected so as to improve the ease of movement of the carrier. Described more specifically, a multi-film reflecting layer consisting of alternately arranged n-AlGaAs or n-AlGaInP films having different Al contents has an electron blockage ΔEc at the boundary of the adjacent two films, as indicated in the conduction band of the energy band of FIG. 2. Similarly, a multi-film reflecting layer consisting of alternately arranged p-AlGaAs or p-AlGaInP films having different Al contents has a hole blockage ΔEv, at the boundary of the adjacent two films, as indicated in the valance band of the energy band of FIG. 3. The values of the electron blockage ΔEc and hole blockage ΔEv are indicated in Table below. In the present surface-light-emitting diode 10, the first multi-film reflecting layer 14 consists of n-AlGaInP films whose electron blockage ΔEc has a lower value (0.35) than that (0.40) of n-AlGaAs films, while the second multi-film reflecting layer 14 consists of p-AlGaAs films whose hole blockage Δ Ev has a lower value (0.60) than that (0.65) of p-AlGaInP films. Accordingly, the first and second reflecting layers 14, 30 have a reduced electric resistance, and an accordingly increased mobility of the carrier, and permit the diode 10 to provide an increased optical output when the diode 10 is driven with a given voltage.

| Blockage Energy | AlGaAs | AlGaInP |
|---|---|---|
| n-type carrier blockage ΔEc | 0.40ΔEc | 0.35ΔEc |
| p-type hole blockage ΔEv | 0.60ΔEv | 0.65ΔEv |

Figure 4:
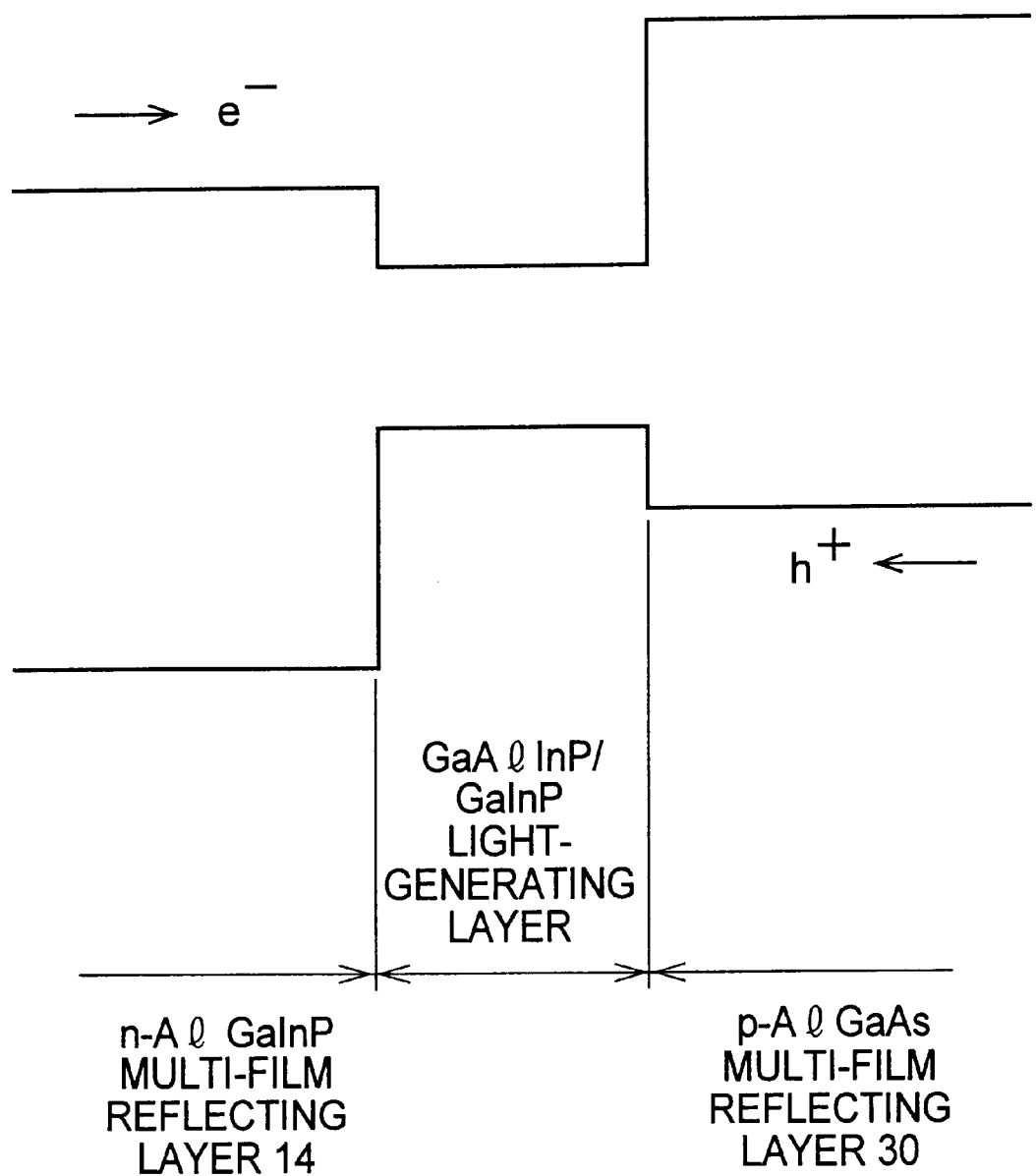
FIG. 4 is a view for explaining an energy band in a laminar semiconductor structure of the surface-light-emitting diode of FIG. 1, which structure include the first and second multi-film reflecting layers and a light-generating layer interposed between the reflecting layers.

The light-generating layer 13–28 of the surface-light-emitting diode 10 according to the present embodiment has is provided with the carrier-enclosing regions $K_e$ and $K_h$ located upstream of the barriers as seen in the direction of movement of the electrons or holes, so that the carrier is enclosed in the carrier-enclosing region $K_e$ and $K_h$, as indicated in the energy band of FIG. 4. Accordingly, the present surface-light-emitting diode 10 has increased optical output and light-emitting efficiency.

Figure 5:
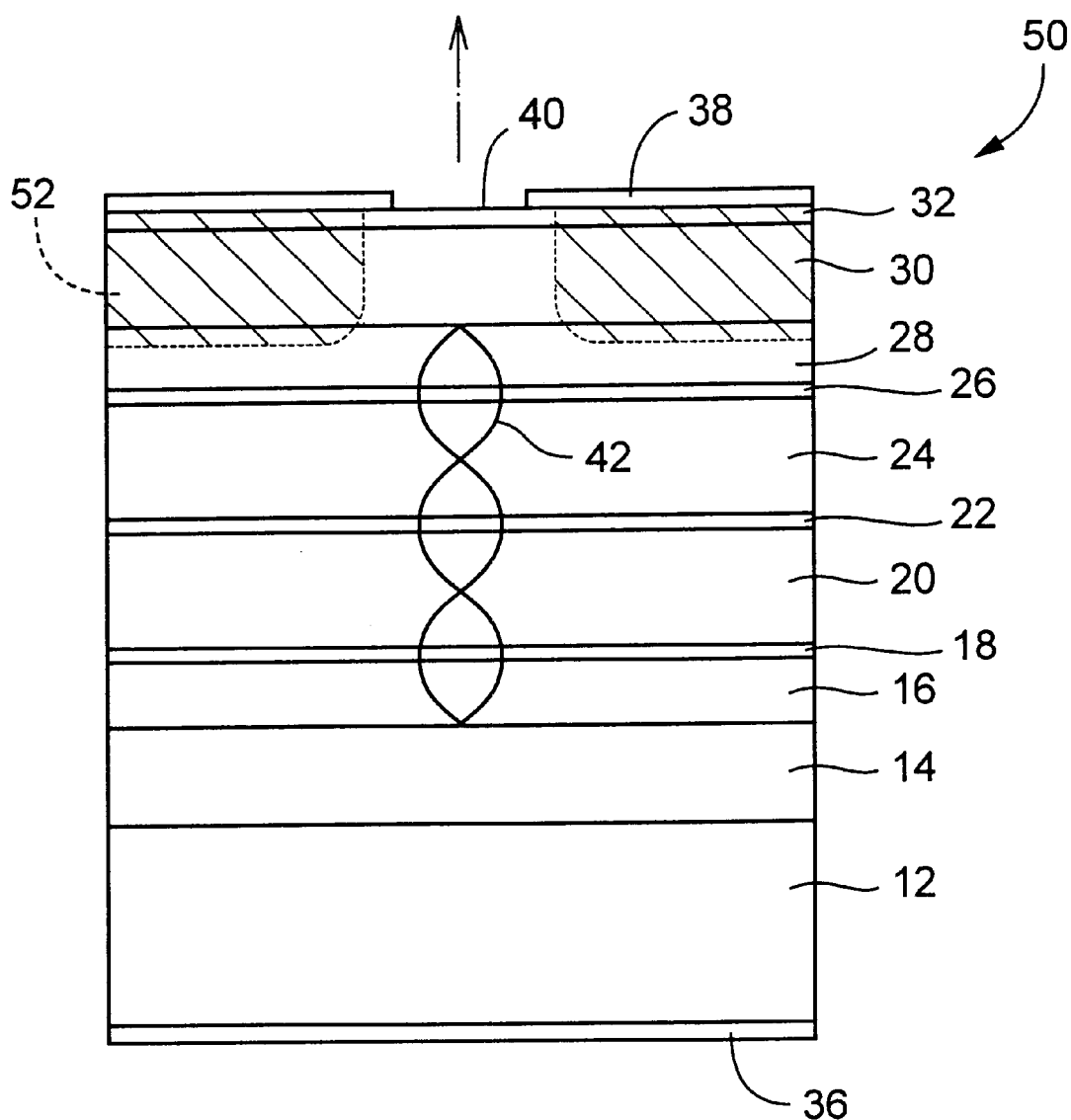
FIG. 5 is a cross sectional view corresponding to that of FIG. 1, schematically illustrating a surface-light-emitting diode according to another embodiment of this invention.
Figure 6:
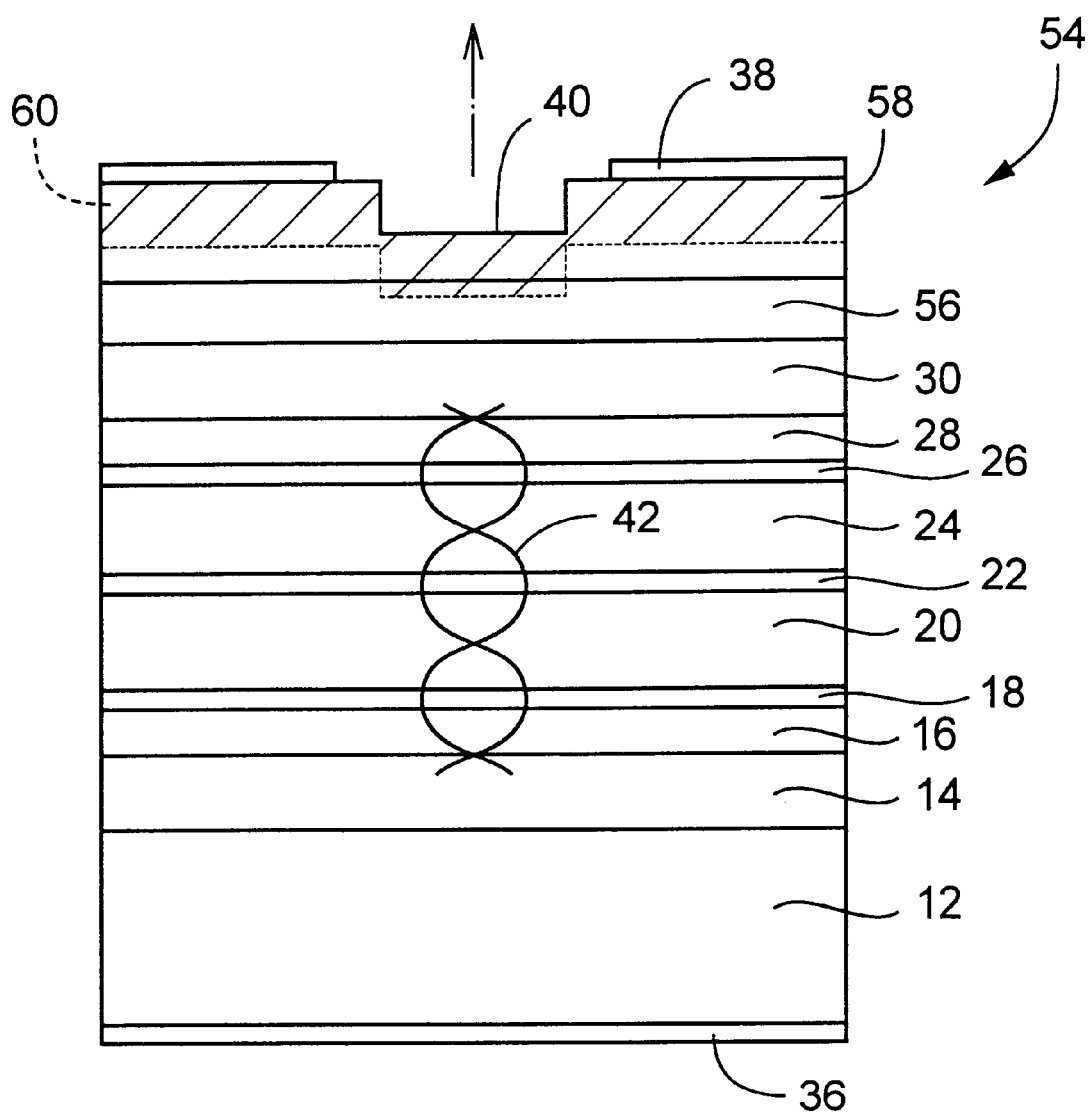
FIG. 6 is a cross sectional view corresponding to that of FIG. 1, schematically illustrating a surface-light-emitting diode according to a further embodiment of the invention.

Referring to FIGS. 5 and 6, there will be shown other embodiments of this invention, wherein the same reference numerals as used in FIG. 1 are used to identify the functionally corresponding elements, which will not be described.

In FIG. 5, there is shown a surface-light-emitting diode 50 which does not have a mesa structure. The present diode 50 is identical with the diode 10 in construction and material selection, except for the elimination of the mesa structure 44 and the provision of an annular current-blocking region 52 in place of the annular non-electrically-conductive current-blocking region 46 (which is formed in the diode 10, by subjecting the exposed peripheral portion of the mesa structure 44 to natural oxidation). The current-blocking region 52 is formed by injecting ions of an impurity into the end portion of the laminar semiconductor structure 14–32 which is remote from the substrate 12. For instance, H+ ions are accelerated by a suitable accelerator, and the accelerated H+ ions are injected into the laminar semiconductor structure, to a predetermined depth, for instance, to the interface between the second reflecting layer 30 and the fourth barrier layer 28. The current-blocking region 52 thus formed consists of annular peripheral portions of the cap layer 32 and second reflecting layer 30 between the annular upper electrode 38 and the fourth barrier layer 28, which annular peripheral portions are charged with the H+ ions and are therefore electrically non-conductive.

Referring next to FIG. 6, there is shown a surface-light-emitting diode 54 which does not include a mesa structure, either. This diode 54 is identical with the diode 10 in construction and material selection, except for the elimination of the mesa structure 44 and the provision of a cladding layer 56 and a current-blocking layer 58 in place of the cap layer 32. Namely, the cladding layer 56 is formed on the second multi-film reflecting layer 30, and the current-blocking layer 58 is formed on the cladding layer 56. The upper electrode 38 is formed on an annular peripheral portion of the upper surface of the current-blocking layer 58. Described in detail, a circular central portion of the upper surface of the current-blocking layer 58 on which the upper electrode 38 is not provided has a recess whose bottom surface serves as the light-emitting surface 40. The current-blocking layer 58 is doped with a p-type dopant impurity such as Zn, through its upper surface, in a thermal diffusion process, whereby a dopant-diffusion region 60 is formed through a considerably large upper thickness portion of the current-blocking layer 58 and a relatively small upper thickness portion of the underlying cladding layer 56. For example, the cladding layer 56 consists of a p-AlGaAs layer having a thickness of about 2 µm grown on the second reflecting layer 30, while the current-blocking layer 58 consists of an n-type AlGaAs layer having a thickness of about 1 µm grown on the cladding layer 56. Since the polarity of the current-blocking layer 58 is reversed with respect to that of the cladding layer 56, a flow of an electric current across the interface of the cladding and current-blocking layers 56, 58 is prevented, except at a central portion of the interface across which the dopant-diffusion region 60 extends. Namely, the dopant-diffusion region 60 has the positive polarity, that is, the same polarity as the cladding layer 56, so that the electric current can flow through the above-indicated central portion of the interface which corresponds to the diameter of the above-indicated recess. Thus, the annular peripheral portion of the dopant-diffusion region 60 serves as a current-blocking section, while the circular central portion of the dopant-diffusion region 60 serves as a current-flow section which permits a flow of the electric current when the diode 54 is energized.

While the presently preferred embodiments of the present invention have been described in detail by reference to the accompanying drawings, the present invention may be otherwise embodied.

In the surface-light-emitting diodes 10, 50, 54 according to the illustrated embodiments, the first multi-film reflecting layer 10 consists of the alternately arranged n-$(Al_{1-x}Ga_x)$InP and n-$(Al_YGa_{1-Y})$InP films while the second multi-film reflecting layer 30 consists of the alternately arranged p-$Al_{1-x}Ga_x$As and p-$Al_YGa_{1-Y}$As films. However, the materials of the films of the first and second multi-film reflecting layers 14, 30 are not strictly limited to AlGaInP and AlGaAs. In essence, the first and second reflecting layers 10, 30 provided on the respective opposite sides of the light-generating layer 16–28 are required to be formed principally or essentially of AlGaInP and AlGaAs, respectively.

In the surface-light-emitting diodes 10 and 50 according to the first and second embodiments are provided with the cap layer 32 which covers the second multi-film reflecting layer 30 and which provides the light-emitting surface 40. However, the cap layer 32 may be eliminated, or replaced by any other suitable layer. Further, at least one additional layer may be provided between the semiconductor substrate 12 and the first reflecting layer 14, and/or between the first reflecting layer 14 and the light-generating layer 16–28, and/or between the light-generating layer 16–28 and the second reflecting layer 30, and/or between the second reflecting layer and the light-emitting surface 40.

The illustrated surface-light-emitting diodes 10, 50, 54 include the three active layers 18, 22, 26 of quantum-well structure each interposed between the adjacent two barrier layers 16, 20, 24, 28. However, the surface-light-emitting device according to the present invention may include two active layers or four or more active layers. Further, the active and barrier layers may be arranged relative to each other such that two or more active layers are located relatively close to each other and in substantial alignment with one antinode of the standing wave 42 within the light resonator. The surface-light-emitting device according to the present invention may use active layers not having a quantum-well structure, provided the light-generating layer including the active layers is interposed between the first and second multi-film reflecting layers 14, 30.

While the distances between the first and second active layers 18, 22 and between the second and third active layers 22, 26 are both equal to about one half (½) of the resonance wavelength in the illustrated embodiments, those distances need not be so determined, but may be selected as desired, so as to be larger than the coherent length of the electrons. To maximize the light-emitting efficiency, however, the distances are preferably shorter than the diffusion length of the carrier, and are more preferably equal to about one half of the resonance wavelength.

Although the active layers 18, 22, 26 in the illustrated embodiments are arranged to generate a light having a peak wavelength of 610 nm, the active layers may be arranged to generate a light having other peak wavelengths, for instance, 650 nm. Where the peak wavelength is 650 nm, the light resonator has a distance L of 975 nm between the first and second reflecting layers 10, 30, and the n-$(Al_{1-x}Ga_x)$InP and n-$(Al_YGa_{-Y})$InP films of the first reflecting layer 14 have respective thickness values of 48 nm and 51 nm, while the p-$Al_{1-x}Ga_x$As and p-$Al_YGa_{1-Y}$As films of the second reflecting layer 30 have respective thickness values of 46 nm and 52 nm.

It is to be understood that the present invention may be embodied with various other changes, modifications and improvements, which may occur to those skilled in the art, without departing from the spirit and scope of the invention defined in the following claims:

What is claimed is:

1. A surface-light-emitting device comprising:

a semiconductor substrate; and a laminar semiconductor structure having a plurality of semiconductor layers formed by epitaxial growth on said semiconductor substrate, said laminar semiconductor structure including, a light-generating layer, and two multi-film reflecting layers between which said light-generating layer is interposed and which comprise a light resonator configured to reflect a light generated by said light-generating layer, said laminar semiconductor structure having a light-emitting surface at one of opposite ends thereof remote from said semiconductor substrate, said light generated by said light-generating layer being emitted from said light-emitting surface, said two-multi-film reflecting layers having a first multi-film reflecting layer formed principally of AlGaInP on said semiconductor substrate, and a second multi-film reflecting layer formed principally of AlGaAs on one of opposite sides of said light-generating layer which is remote from said semiconductor substrate, and said light-generating layer including at lease one active layer interposed between adjacent two barrier layers, each of said at least one active layer being formed of a GaInP monocrystalline compound semiconductor layer.

2. A surface-light emitting device according to claim 1, wherein each of said adjacent two barrier layers is formed of a AlGaInP monocrystalline compound semiconductor layer.

* * * * *

UNITED STATES PATENT AND TRADEMARK OFFICE
CERTIFICATE OF CORRECTION

PATENT NO.    : 6,570,191 B2
DATED         : May 27, 2003
INVENTOR(S)   : Mizuno et al.

It is certified that error appears in the above-identified patent and that said Letters Patent is hereby corrected as shown below:

<u>Title page, Item [54] and Column 1, line 1,</u>
Title should read: -- [54] SURFACE-LIGHT-EMITTING DEVICE INCLUDING ALGAINP AND ALGAAS MULTI-FILM REFLECTING LAYERS --

Signed and Sealed this

Twenty-third Day of September, 2003

JAMES E. ROGAN
*Director of the United States Patent and Trademark Office*